United States Patent [19]

Adam

[11] Patent Number: 4,554,519
[45] Date of Patent: Nov. 19, 1985

[54] MAGNETOSTATIC WAVE DELAY LINE
[75] Inventor: John D. Adam, Murrysville, Pa.
[73] Assignee: Westinghouse Electric Corp., Pittsburgh, Pa.
[21] Appl. No.: 542,840
[22] Filed: Oct. 17, 1983
[51] Int. Cl.[4] .............................................. H03H 9/30
[52] U.S. Cl. .................................... 333/141; 310/26; 333/145; 333/147; 333/148
[58] Field of Search ................... 333/24.1, 24.2, 24.3, 333/141–156, 193–196, 245, 246, 248; 331/107 A; 310/26, 313 R, 313 A, 313 B, 313 C, 313 D; 357/25–27; 364/819–824

[56] References Cited
U.S. PATENT DOCUMENTS

3,864,647  2/1975  Bongianni ........................ 333/148 X
3,935,550  1/1976  Adam et al. ...................... 333/148 X
4,028,639  6/1977  Hagon et al. ......................... 333/148
4,314,214  2/1982  Castera et al. ...................... 333/141
4,400,669  8/1983  Daniel et al. .................... 333/147 X Primary Examiner—Marvin L. Nussbaum
Attorney, Agent, or Firm—J. R. Hinson

[57] ABSTRACT

A magnetostatic wave device operating within a biasing magnetic field for delaying microwave signals is described including a layer of YIG material having a predetermined thickness, first and second transducers spaced apart for generating and receiving magnetostatic waves in the YIG material and a ground plane having a plurality of spacings from said YIG material, each spacing having a predetermined length along the propagation path between the first and second transducers. The invention further includes first and second layers of YIG material, first and second transducers spaced apart for generating magnetostatic waves in said first material and said first material having a plurality of spacings from said second material, each spacing having a predetermined length along the propagation path from said first to said second transducer. The invention overcomes the problem of undesired phase or group delay variations from a desired linear or quadratic phase variation as a function of frequency.

24 Claims, 16 Drawing Figures

MAGNETOSTATIC WAVE DELAY LINE

GOVERNMENT CONTRACT

The Government has rights in this invention pursuant to Contract No. F19628-80-C-0150 awarded by the Department of the Air Force.

CROSS-REFERENCE TO RELATED APPLICATIONS

This application is cross-referenced to an application entitled "Magnetostatic Wave Delay Line Having Improved Group Delay Linearity" by M. R. Daniel, R. A. Moore and J. D. Adam having Ser. No. 305,667, filed on Sept. 25, 1981, now U.S. Pat. No. 4,400,669, and assigned to the Government of the United States under the terms of contract with Westinghouse Electric Corporation. The inventors were employees of Westinghouse Electric Corporation at the time of the invention. The application describes a magnetostatic wave delay line wherein the group delay versus frequency through the delay line is improved by adjusting the magnetic biasing field H, the spacing of the garnet film from the ground plane or the thickness of the garnet film itself. As shown in FIG. 5 and discussed at page 7 of the application, the distance between the magnetic garnet crystal film substrate 10 and the ground plane 11 is varied uniformly between the input and output transducers, for example from 10 to 30 micrometers. The embodiment of FIG. 5 can be realized by merely tapering dielectric spacer 12 positioned between substrate 10 and ground plane 11.

This application is further cross-referenced to an application entitled "Magnetostatic Wave Device" by K. W. Loh and P. R. Emtage having Ser. No. 443,728, filed on Nov. 22, 1982, now U.S. Pat. No. 4,465,986, to the assignee herein, which describes a magnetostatic wave delay line having an input and output transducer spaced apart on a magnetic medium such as yttrium-iron-garnet (YIG). A conductive pattern 56 as shown in FIG. 2 is positioned on the magnetic medium 40 between the input and output transducers 52 and 60, respectively. The impedance on the conductive paths 58 of conductive pattern 56 may be altered such as by variable impedance 64 in accordance with an applied governing signal 66 to cause a variation in the propagation velocity of the magnetostatic waves passing below conductive pattern 56 as discussed at page 8 of the application.

In U.S. Pat. No. 4,395,686 which issued on July 26, 1983 to J. D. Adam, the inventor herein, the patent of which is assigned to the assignee herein, a magnetostatic wave device is described comprising material suitable for propagating magnetostatic waves, an input and output transducer and a plurality of resistor strips spaced apart from one another and positioned above and transverse to the propagation path of the magnetostatic waves. The resistor strips function to attenuate selected modes of propagating magnetostatic waves occurring due to the finite width of the magnetostatic wave material.

BACKGROUND OF THE INVENTION

Field of the Invention

This invention relates to magnetostatic wave devices and more particularly to a magnetostatic wave delay line having a predetermined linear or quadratic phase variation over a predetermined frequency range.

Description of the Prior Art

In U.S. Pat. No. 4,314,214, which issued on Feb. 2, 1982 to J. P. Castera, P. Hartemann, and J. M. DuPont, a magnetostatic-wave device is described comprising a ferromagnetic layer for propagating magnetostatic waves along a path and an array of conductive strips positioned on the ferromagnetic layer such as shown in FIG. 1. Current is induced into the conducting strips by magnetostatic waves passing underneath these strips.

In U.S. Pat. No. 3,935,550, which issued on Jan. 27, 1976 to J. D. Adam, the inventor herein, and J. H. Collins, a group delay equalizer was described incorporating a magnetostatic delay line such as shown in FIGS. 3A through 3C. In FIG. 7, a delay line is shown comprising YIG film 23 separated from a brass ground plane 22 by a dielectric layer 21. The dielectric layer 21 is formed from Gadolinium Gallium Garnet (GGG) on which the YIG film 23 was grown. FIG. 8 shows three curves 38 through 40 of delay per centimeter versus frequency over the frequency range 1 to 1.5 gigahertz calculated from equation (2) for a device having the dimensions D of 50 microns for dielectric spacing and T of 7 micrometers for YIG film thickness. At bias fields of 0, 20 and 40 Oersted respectively.

In U.S. Pat. No. 3,864,647, which issued on Feb. 4, 1975 to W. L. Bongianni, non-dispersive and linearly dispersive magnetic delay lines are described. FIG. 3 shows a delay line with magnetic wave active material 24 and 28 on either side of magnetic wave inactive material 22. FIG. 6 shows a delay line with a ground plane 48 covered by a layer of magnetic wave inactive material 46 covered by a layer of magnetic wave active material 44 covered with a layer of magnetic wave inactive material 42 covered with a layer of magnetic wave active material 41. FIG. 6 shows a linearly dispersive magnetic delay line.

It is therefore desirable to provide a magnetostatic wave device having a delay which varies linearly with frequency or is constant with frequency.

It is further desirable to provide a magnetostatic wave device having a medium suitable for propagating magnetostatic waves and a first and second ground plane, side by side, each having a predetermined spacing from the medium and each having a predetermined length along the propagation path.

It is further desirable to provide a magnetostatic wave device having a medium suitable for propagating magnetostatic waves and a ground plane having a continuous variation in spacing other than a linear variation in spacing to get a minimum phase error with respect to a quadratic phase variation with frequency.

It is further desirable to provide a magnetostatic wave device comprising a plurality of sections wherein each section has a medium suitable for propagating magnetostatic waves and a ground plane spaced by a predetermined distance from its respective medium and having a predetermined length along the propagation path.

It is further desirable to provide a dispersive delay line utilizing a yttrium iron garnet (YIG) film and a ground plane having a plurality of spacings from the YIG film.

It is further desirable to provide a magnetostatic wave device comprising first and second mediums suitable for propagating magnetostatic waves which are spaced apart from one another by a plurality of predetermined distances.

SUMMARY OF THE INVENTION

In accordance with the present invention, a magnetostatic wave device operable within a biasing magnetic field for delaying microwave signals is described comprising a material suitable for propagating magnetostatic waves such as a yttrium iron garnet film, a first and second transducer located in spaced apart relationship for generating and receiving magnetostatic waves along a path in the material and a plurality of ground planes coupled together, side by side, wherein each ground plane has a predetermined length along the propagation path in the material and wherein each ground plane is spaced by a predetermined distance from the material whereby the delay of microwave signals varies by a predetermined amount with frequency.

The invention further provides a magnetostatic wave device operable with a biasing magnetic field for delaying microwave signals comprising a material suitable for propagating magnetostatic waves such as yttrium iron garnet film, a first and second transducer located in spaced apart relationship for generating and receiving magnetostatic waves along a path in the material and a ground plane having a continuous non-linear spacing in the direction along the propagation path in the material.

The invention further provides a magnetostatic wave device operable within a biasing magnetic field for delaying microwave signals comprising a first material suitable for propagating magnetostatic waves such as yttrium iron garnet, second material suitable for propagating magnetostatic waves such as yttrium iron garnet spaced apart from the first material by a plurality of predetermined distances, said first and second transducers located in spaced apart relationship for generating and receiving magnetostatic waves along a path in the first material whereby the delay of microwave signals varies by a predetermined amount with frequency.

DESCRIPTION OF THE PREFERRED EMBODIMENT

Figure 1:
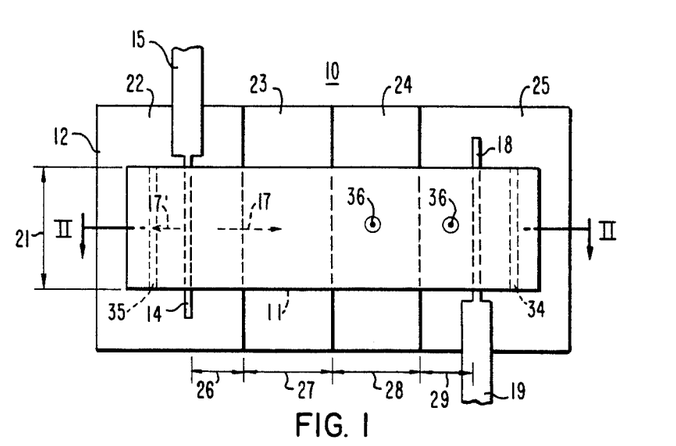
FIG. 1 is a top view of one embodiment of the invention.
Figure 2:
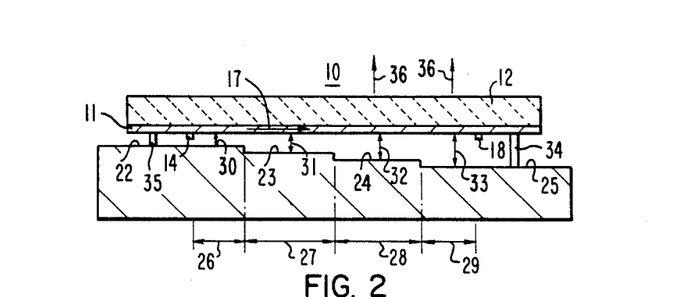
FIG. 2 is a cross-section view along the lines II—II of FIG. 1.

Referring to the drawing and in particular to FIG. 1, a magnetostatic wave device 10 is shown. FIG. 2 shows a cross-section view along the lines II—II of FIG. 1. A material 11 suitable for propagating magnetostatic waves is shown. Material 11 which may for example be a film of yttrium iron garnet (YIG) having a predetermined thickness such as from 5 to 50 micrometers may be deposited on substrate 12. Other examples of material 11 besides YIG is lithium ferrite and lanthanum gallium doped YIG. Substrate 12 functions as a base to grow and to support material 11 and may be Gadolinium Gallium Garnet (GGG). Transducer 14 which may for example be a conductor on material 11 having terminal 15 functions to generate magnetostatic waves in material 11 along a propagation path 17 in response to microwave signals coupled to terminal 15 of transducer 14. The microwave signals may for example be within a predetermined frequency range such as in a 1 gigahertz bandwidth anywhere between 1 to 20 gigahertz. One predetermined frequency range may be from 9.1 to 10 gigahertz. Transducer 18 functions to convert magnetostatic waves received along propagation path 17 in material 11 to microwave signals which are available at terminal 19. Transducers 14 and 18 are spaced apart by a predetermined distance. Transducer 18 may be for example a conductor on material 11 for detecting or sensing magnetic fields provided by magnetostatic waves propagating in material 11.

Material 11 may have for example a predetermined width such as 5 millimeters shown by arrow 21. A plurality of ground planes 22 through 25 are coupled together and have low ohmic conductivity, less than 0.1 ohm per square at microwave frequencies. Each ground plane 22 through 25 has a predetermined length along propagation path 17 as shown by arrows 26 through 29 respectively. Ground planes 22 through 25 may be as wide or wider than material 11 and each ground plane is spaced from material 11 by a predetermined distance shown by arrows 30 through 33 respectively. Ground planes 22 through 25 may be formed for example by machining a piece of metal such as copper, aluminum, or brass or by etching a semiconductor such as silicon or gallium arsenide or by etching glass to provide steps represented of the relative spacings of adjacent ground planes and spaced from material 11 by spacers 34 and 35. Ground planes 22 through 25 may be plated such as from 2 to 5 micrometers with silver, gold etc. for low ohmic conductivity.

In operation each ground plane with respect to material 11 functions as a magnetostatic wave delay line providing a predetermined delay as a function of frequency. The total delay between transducers 14 and 18 is merely the sum of the delays provided by material 11 over ground planes 22 through 25 as a magnetostatic wave travels from transducer 14 to transducer 18 or vice versa.

In FIGS. 1 and 2 material 11 is subjected to a magnetic bias field orthogonal to the plane of material 11 shown by arrow 36. A suitable magnetic bias of 4950 Oersteds was provided for the 32 micrometer thick material 11 which may be a YIG layer. With the magnetic bias field orthogonal to material 11 as shown by arrow 36 a forward volume wave FVW is propagated. With the magnetic bias field in the plane of material 11 and in the direction of propagation of a magnetostatic wave, a backward volume wave BVW is propagated. With the magnetic bias field in the plane of material 11 and transverse to the direction of propagation of a magnetostatic wave, a surface wave (SW) is propagated.

Figure 3:
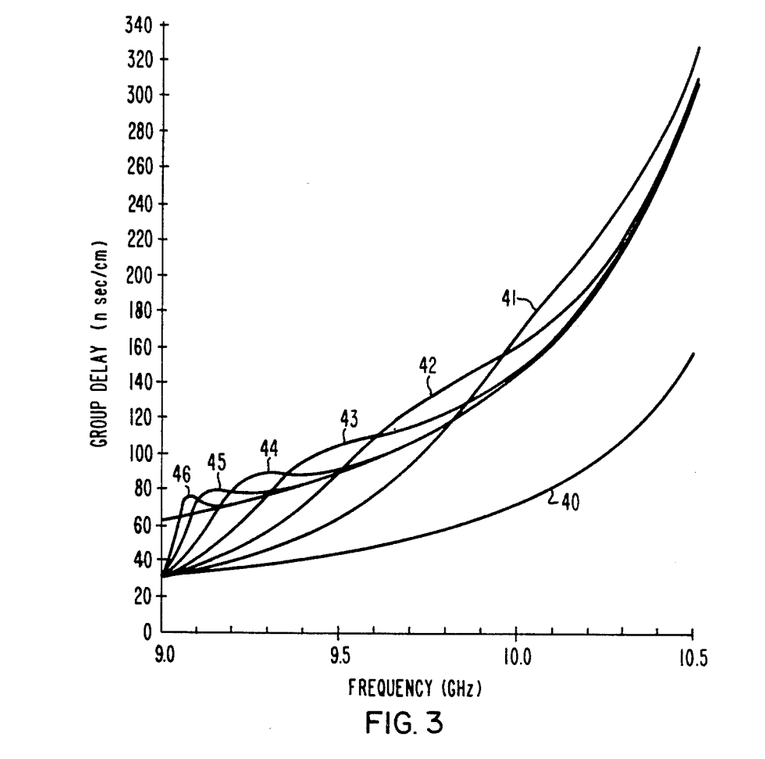
FIG. 3 is a graph showing a variation of group delay with frequency of a magnetostatic wave on one section of the embodiment of FIG. 1.

FIG. 3 is a graph showing the variation of group delay with frequency of a magnetostatic wave in one section of magnetostatic wave device 10 shown in FIGS. 1 and 2. In FIG. 3 the ordinate represents group delay in nanoseconds per centimeter and the abscissa represents frequency in gigahertz. Curves 40 through 46 show the group delay of a magnetostatic wave versus frequency in a YIG film 11 over a ground plane 22 with constant spacing. The YIG film 11 has a thickness of 20 micrometers and the spacing t from ground plane 22 for curve 40 is 0 micrometers. The spacing t of YIG film 11 from ground plane 22 for curves 41 through 46 is 12.5, 25, 50, 100, 200 and 400 micrometers respectively. By utilizing a family of curves such as shown in FIG. 3 the lengths 26 through 29 and the spacings 30 through 33 of ground planes 22 through 25 may be adjusted respectively to provide a predetermined composite curve showing group delay as a function of frequency.

Figure 4:
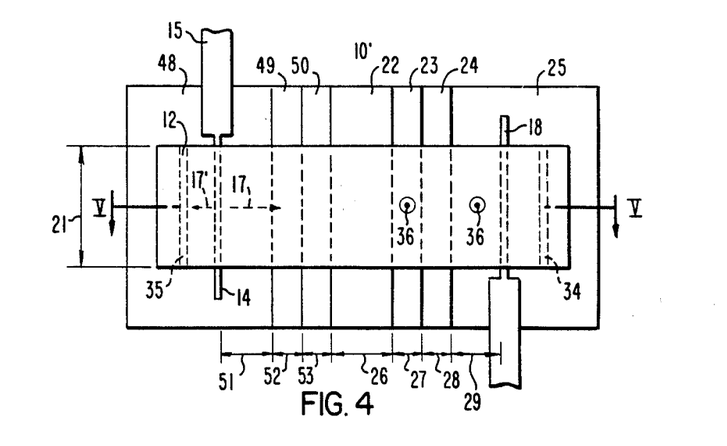
FIG. 4 is a top view of a first alternate embodiment of the invention.
Figure 5:
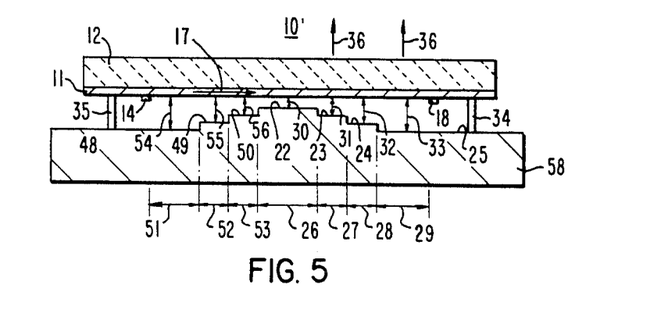
FIG. 5 is a cross-section view along the lines V—V of FIG. 4.

FIG. 4 shows an alternate embodiment of the invention. FIG. 5 shows a cross-section view along the lines V—V of FIG. 4. In FIGS. 4 and 5 like references are used for functions corresponding to the apparatus of FIG. 1. FIG. 4 shows additional ground planes 48 through 50 each having a length 51 through 53 respectively and a space 54 through 56 from material 11. As shown in FIG. 5 ground plane 50 is adjacent to ground plane 22. Ground planes 22 through 25 and 48 through 50 may be formed by machining metal such as brass to provide surfaces for the ground planes at various heights with respect to one another. In order to reduce attenuation of the magnetostatic wave in material 11 the ground plane should be of low resistance. If the ground plane is comprised of brass, gold or silver may be plated on the upper surface of the brass material 58.

As shown in FIGS. 1 and 4, material 11 may be for example 5 millimeters wide and have a thickness in the range from 5 to 50 micrometers. Substrate 12 may be for example 0.5 millimeters thick. Transducer 14 may be likened to an antenna with the length of the antenna corresponding to the width of material 11 to be a half wavelength of the midband frequency of a desired bandwidth.

It is preferable to locate transducers 14 and 18 at a location on material 11 where the ground plane is spaced from the respective transducer to provide noninterference or a predetermined impedance between transducers 14 and 18 and the ground plane below them. As shown in FIGS. 1 and 4 transducers 14 and 18 are placed interior of the ends of material 11. If forward volume waves (FVW) are generated by transducer 14 they tend to be generated in both directions in material 11 along propagation path 17 and in the opposite direction 17'. Various techniques are used at the end of material 11 to attenuate magnetostatic waves so as to prevent their reflection back along propagation path 17. One such technique is by introducing defects in the surface of material 11 by a jet of abrasive particles as described in U.S. Pat. No. 4,316,162 which issued on Feb. 16, 1982 to G. Volluet and D. Cohen.

The space between material 11 and ground planes 22 through 25 and 48 through 50 may be filled for example with air or a dielectric material such as ceramic or glass.

Figure 6:
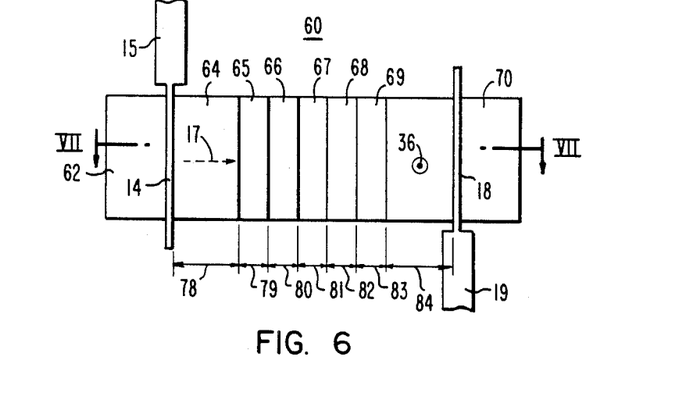
FIG. 6 is a top view of a second alternate embodiment of the invention.
Figure 7:
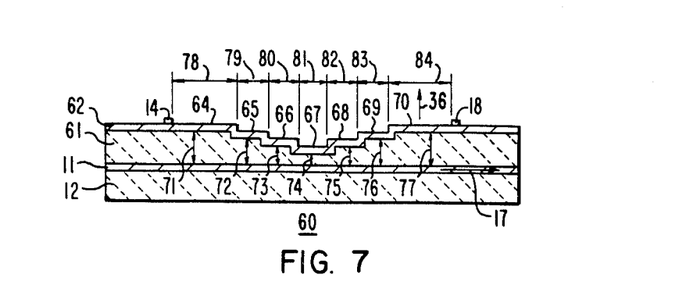
FIG. 7 is a cross-section view along the lines VII—VII of FIG. 6.

FIG. 6 is a top view of a magnetostatic wave device 60 and FIG. 7 is a cross-section view along the lines VII—VII of FIG. 6. In FIG. 6 like references are used for functions corresponding to the apparatus of FIG. 1. As shown in FIG. 7 a substrate 12 of GGG material has a layer of material 11 grown or deposited thereover. A layer 61 of samarium doped GGG material is grown over material 11. Samarium is added to the GGG material to match the lattice parameter of material 11 when material 11 is for example yttrium iron garnet. Layer 61 may have a thickness in the range from 5 to 50 micrometers. Layer 61 may be etched for example to form steps of predetermined thickness or a plurality of surfaces each being planar by masking layer 61 to expose predetermined areas and etching with hot phosphoric acid, $HPO_3$. Alternatively, layer 61 may be etched to form a continuous surface having a predetermined varying thickness.

A second layer of material 62 may be deposited over layer 61 after it is etched which is suitable for propagating magnetostatic waves such as for example yttrium iron garnet. Layer 62 may be in the range from 5 to 50 micrometers thick. Transducer 14 functions to launch magnetostatic waves in material 62 in the direction of transducer 18 which functions to receive magnetostatic waves. Transducer 18 functions to convert magnetostatic waves into microwave signals. Transducer 14 may for example generate forward volume waves (FVW), backward volume wave (BVW) and surface waves (SW).

As can be seen layer 61 has surfaces 64 through 70 which are level with respect to material 11 and are spaced apart from material 11 by distances 71 through 77 respectively. Surfaces 64 through 70 have lengths in the direction of propagation 17 as shown by lengths 78 through 84 respectively. While steps or surfaces 64 through 70 are shown, a continuous variation in thickness of layer 61 may be obtained by withdrawing a layer of GGG coated with YIG film at a controlled rate from a hot $HPO_3$ etch. One example of a continuous thickness variation of layer 61 in FIG. 7 or of spacing of material 11 from a ground plane in FIG. 2 is a quadratic variation (parabolic) in thickness described by a second degree polynomial of the form $Y = A + BX^2$.

Figure 8:
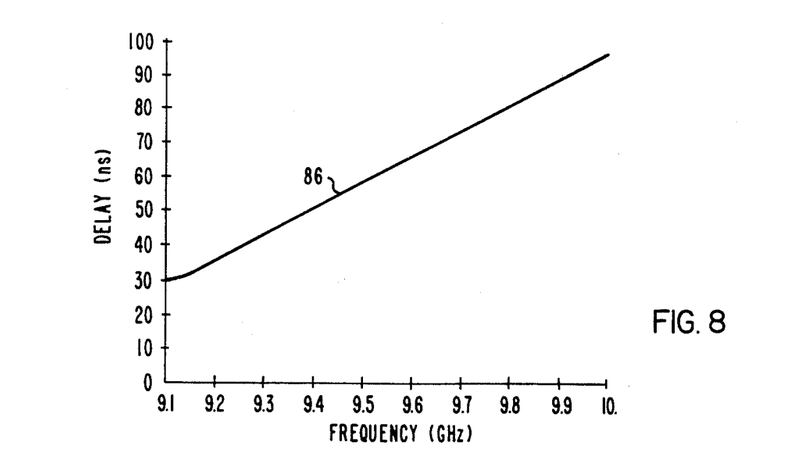
FIG. 8 is a graph showing the calculated group delay versus frequency for the embodiment of FIG. 1 with dimensions as shown in Table I.

FIG. 8 is a graph showing the calculated group delay versus frequency for the embodiment of FIG. 1 with dimensions as shown in Table I.

TABLE I

| Section Number, n | Ground Plane Spacing, $t_n$ (cm) | Section Length, $l_n$ (cm) |
| --- | --- | --- |
| 1 | 0.0032 | 0.180 |
| 2 | 0.0045 | 0.369 |
| 3 | 0.0075 | 0.155 |
| 4 | 0.0136 | 0.296 |

In FIG. 8 the material suitable for propagating magnetostatic waves is yttrium iron garnet grown on GGG substrate with a thickness of 32 micrometers. In FIG. 8 the ordinate represents delay in nanoseconds and the abscissa represents frequency in gigahertz. Curve 86 shows the delay versus frequency.

Figure 9:
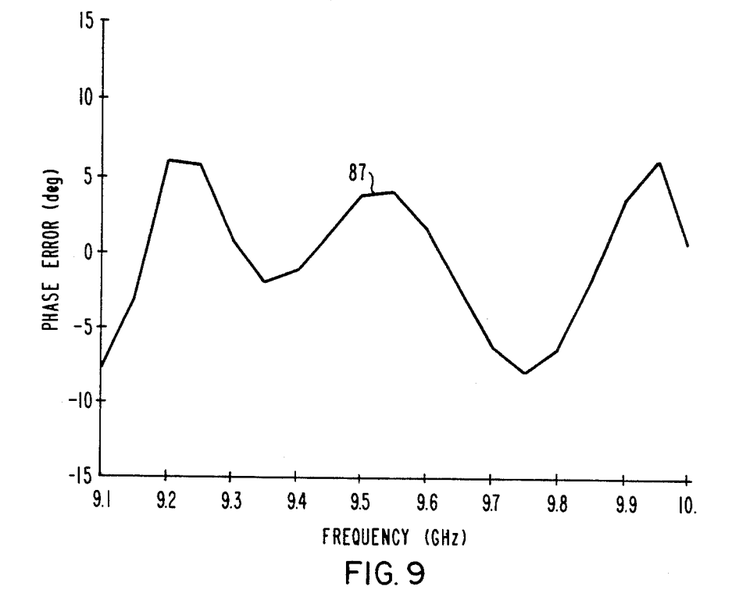
FIG. 9 is a graph showing the calculated phase error versus frequency for the embodiment of FIG. 1 with dimensions as shown in Table I.

FIG. 9 is a graph showing the calculated phase error versus frequency for the embodiment of FIG. 1 with dimensions as shown in Table I YIG film 11 of 32 micrometers thick. In FIG. 9 the ordinate represents phase error in degrees and the abscissa represents frequency in gigahertz. Curve 87 shows the phase error from a quadratic phase variation with frequency which provides a linear delay with frequency as shown in FIG. 8.

Figure 10:
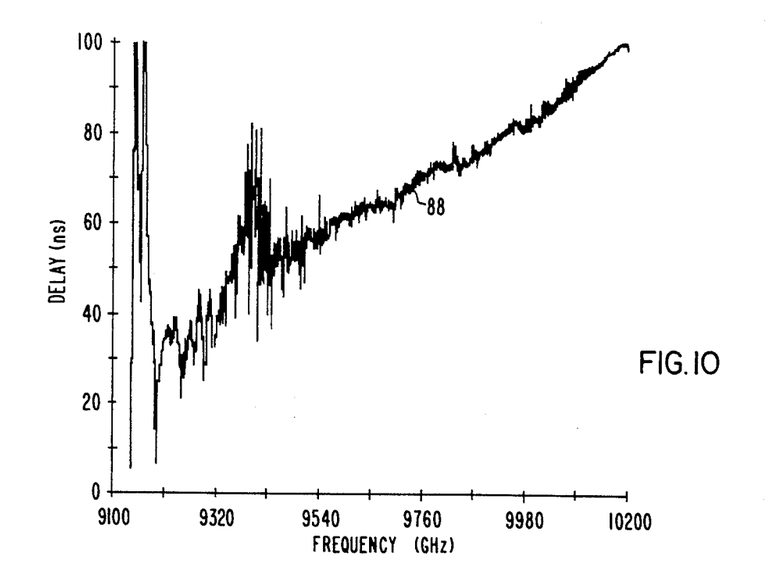
FIG. 10 is a graph showing measured group delay versus frequency for the embodiment of FIG. 1 with dimensions as shown in Table I.

FIG. 10 is a graph showing measured group delay versus frequency for the embodiment of FIG. 1 as shown by curve 88 with dimensions as shown in Table I. Material 11 was a YIG film 32 micrometers thick. In FIG. 10 the ordinate represents delay in nanoseconds and the abscissa represents frequency in gigahertz. The magnetic bias field was 4950 Oersteds and normal to material 11. In FIG. 10 the delay variation per frequency is equal to the rate of change in phase variation per frequency $d\phi/d\omega$. A quadratic phase variation with frequency gives a linear group delay with frequency. A linear phase change with frequency gives a constant group delay with frequency.

Figure 11:
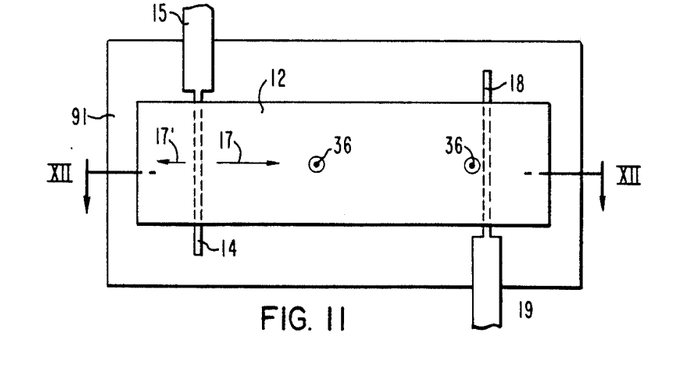
FIG. 11 is a top view of an alternate embodiment of the invention.
Figure 12:
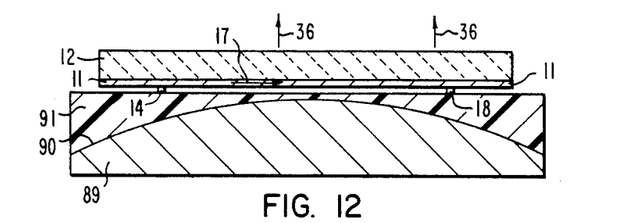
FIG. 12 is a cross-section view along the lines XII—XII of FIG. 11.

FIG. 11 is a top view of an alternate embodiment of the invention. FIG. 12 shows a cross-section view along the lines XII—XII of FIG. 11. In FIGS. 11 and 12 like references are used for functions corresponding to the apparatus of FIG. 1. FIG. 12 shows the contour of a continuously variable ground plane 89 spaced by a predetermined distance from material 11. The surface 90 of ground plane 89 is a parabola in the direction of propagation shown by arrow 17. The conducting surface 90 is of constant spacing in the transverse direction to arrow 17. A dielectric material 91 is shown which functions to support material 11 and substrate 12.

Figure 13:
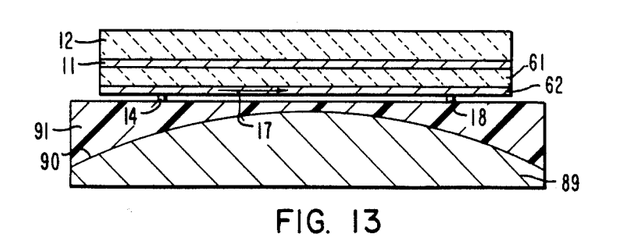
FIG. 13 is a cross-section view along the lines XII—XII of FIG. 11 showing an alternate embodiment.

FIG. 13 is a cross-section view along the lines XII—XII of FIG. 11 showing an alternate embodiment of the invention. FIG. 13 shows a double layer of YIG material 11 and 62 separated by layer 61. The double layer was previously described with references to FIGS. 6 and 7.

Figure 14:
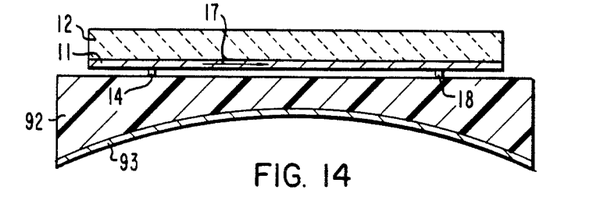
FIG. 14 is a cross-section view along the lines XII—XII of FIG. 11 showing an alternate embodiment.

FIG. 14 is a cross-section view along the lines XII—XII of FIG. 11 showing an alternate embodiment. As shown in FIG. 14 a dielectric 92 such as glass has a continuously variable spacing which may be parabolic in the direction of propagation and constant in the direction transverse to the direction of propagation shown by arrow 17. Dielectric 92 may have a coating 93 which may for example be gold or silver or other low ohmic material having a resistance of less than 0.1 ohms per square. Coating 93 functions to provide a ground plane or conducting surface spaced from material 11.

Figure 15:
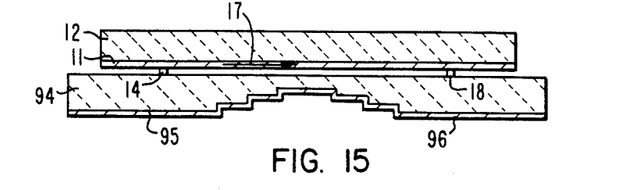
FIG. 15 is a cross-section view along the lines V—V of FIG. 4 showing an alternate embodiment.

FIG. 15 is a cross-section view along the lines V—V of FIG. 4 showing an alternate embodiment. In FIG. 15 a substrate 94 which may for example be of semiconductor material such as germanium, silicon or gallium arsenide which has been etched to form steps. A coating or layer 96 is deposited on lower surface 95 of substrate 94. Layer 96 may for example be formed by depositing gold or other low ohmic material. Layer 95 forms ground planes 22 through 25 and 48 through 50 each having a predetermined spacing from material 11.

Figure 16:
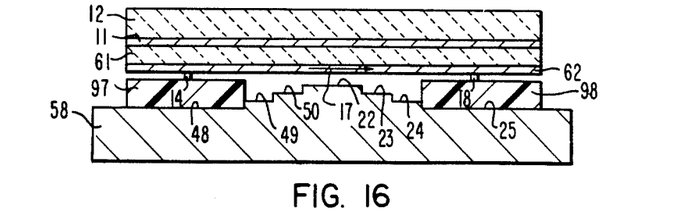
FIG. 16 is a cross-section view along the lines V—V of FIG. 4 showing an alternate embodiment.

FIG. 16 is a cross-section view along the lines V—V of FIG. 4 showing an altenate embodiment. In FIG. 16 a double layer of YIG material 11 and 62 is shown spaced apart by layer 61. Dielectric supports 97 and 98 are shown which space material 62 by a predetermined distance from ground planes 22 to 25 and 48 to 50. As shown in FIG. 16 layer 61 is of uniform thickness such that materials 11 and 62 are parallel to one another and planar.

For efficient magnetostatic wave transducers, such as transducers 14 and 18 shown in FIG. 1, material 11 should be located at or close to a current maximum in transducers 14 and 18. At low frequencies where the electromagnetic wavelength in the microstrip transducer 14 or 18 is much longer than the width of material 11, the end of transducers 14 and 18 may be short circuited to the ground plane. At high frequencies where the electromagnetic wavelength is comparable to the width of material 11, short circuiting of the end of transducers 14 and 18 would result in a non-uniform current distribution under material 11 which is undesirable. In this case, transistors 14 and 18 are open circuited at their ends and the center of material 11 is located a quarter wavelength from the open circuited transducer end. At low frequencies, transducers 14 and 18 may also be open circuit at their ends.

A technique to decrease the phase error of magnetostatic wave delay lines has been described. The delay line is divided into sections each with a different spacing between a ground plane and the YIG film. The length of each section in a direction of propagation is then optimized to yield a best fit to a linear or a quadratic phase with frequency variation. Use of a finite number of sections results in a residual delay ripple, however, a continuous variation in spacing of the correct form would in principle provide zero phase error. This technique is also applicable to double YIG film delay lines in which the spacing between the two films is optimized such as shown in FIGS. 6 and 7 to yield a minimum phase error. Low phase error dispersive or adjustable delay lines have application in analog signal processing directly at microwave frequencies and in beam steering in phased array antennas.

I claim:

1. A magnetostatic wave device operable within a biasing magnetic field for delaying microwave signals wherein the delay varies by a predetermined amount with frequency comprising:
   a body of yttrium iron garnet for propagating magnetostatic waves having a thickness in the range of 5 to 50 micrometers,
   first and second transducers located in spaced apart relationship for generating and receiving magnetostatic waves along a path in said body of yttrium iron garnet,
   a plurality of ground planes coupled together, said ground planes formed from a common metal block having a layer of plated gold, each ground plane having a predetermined length along said path in said material and spaced by a predetermined distance from said material.

2. A magnetostatic wave device operable within a biasing magnetic field for delaying microwave signals, whereby the delay varies by a predetermined amount with frequency comprising:
   first material suitable for propagating magnetostatic waves,
   second material suitable for propagating magnetostatic waves spaced apart by a plurality of predetermined distances from said first material,
   a first transducer positioned to generate magnetostatic waves in said first material from said microwave signals coupled thereto which propagate along a path in said first material, a second transducer positioned to receive said magnetostatic waves in said first material to convert said magnetostatic waves to microwave signals.

3. The magnetostatic wave device of claim 2 wherein said first and second materials are spaced apart in a range from 5 to 50 micrometers.

4. The magnetostatic wave device of claim 2 wherein said first and second material are each in the range from 5 to 50 micrometers thick.

5. The magnetostatic wave device of claim 2 wherein said first and second material each includes yttrium iron garnet.

6. The magnetostatic wave device of claim 2 wherein said first and second material are separated by a layer of samarium doped GGG material.

7. The magnetostatic wave device of claim 2 wherein said first material is spaced from said second material by a plurality of predetermined spacings for a predetermined length along said propagation path.

8. The magnetostatic wave device of claim 2 wherein said distance between said first and second material is controlled by a layer of samarium doped GGG material having its upper surface etched to provide a plurality of spacings each having a predetermined length in the propagation direction.

9. The magnetostatic wave device of claim 2 wherein said first material and second material include yttrium iron garnet having a thickness from 5 to 50 micrometers.

10. A method for fabricating a magnetostatic wave device comprising:

forming yttrium iron garnet on a substrate of GGG material, forming a layer of samarium doped GGG material over said YIG material, etching said samarium doped GGG material to form a plurality of thicknesses, each thickness having a predetermined length in the propagation direction, forming a second layer of YIG material over said samarium doped GGG material, forming a first and second transducer spaced apart at a first and second end of said second layer of YIG material.

11. The method of claim 10 further including the step of etching said samarium doped GGG material with hot phosphoric acid $HPO_3$.

12. The method of claim 10 further including forming said first and second layer of YIG material in the thickness from 5 to 50 micrometers.

13. A magnetostatic wave device operable within a biasing magnetic field for delaying microwave signals wherein the delay varies by a predetermined amount with frequency comprising:

first material suitable for propagating magnetostatic waves, first and second transducers located in spaced apart relationship for generating and receiving magnetostatic waves along a path in said first material, a ground plane having a continuous non-linear spacing in the direction along said path from said material.

14. The magnetostatic wave device of claim 13 wherein said first material includes yttrium iron garnet.

15. The magnetostatic wave device of claim 13 wherein said first material is in the range from 5 to 50 micrometers thick.

16. The magnetostatic wave device of claim 13 wherein said continuous non-linear spacing is described by a second degree polynomial.

17. The magnetostatic wave device of claim 13 wherein said ground plane includes a layer of conductive material over a substrate of dielectric material having one side shaped to provide continuous non-linear spacing in the direction along said path.

18. The magnetostatic wave device of claim 17 wherein said dielectric material includes glass.

19. The magnetostatic wave device of claim 13 further including a second material suitable for propagating magnetostatic waves spaced apart from said first material.

20. The magnetostatic wave device of claim 19 wherein said second material is positioned above said first material and said ground plane.

21. The magnetostatic wave device of claim 13 wherein the spacing from said material in the direction orthogonal to said direction along said path is constant.

22. A magnetostatic wave device operable within a biasing magnetic field for delaying microwave signals wherein the delay varies by a predetermined amount with frequency, comprising:

(a) a body of material suitable for propagating magnetostatic waves;

(b) first and second transducers located in spaced apart relationship for generating an receiving magnetostatic waves along a path in said material;

(c) a plurality of ground planes include continuous metal surfaces to provide a continuous variation in spacing of said ground plane from said material.

23. A magnetostatic wave device operable within a biasing magnetic field for delaying microwave signals wherein the delay varies by a predetermined amount with frequency, comprising:

(a) a body of material for propagating magnetostatic waves;

(b) first and second transducers located in spaced apart relationship for generating and receiving magnetostatic waves along a path in said material;

(c) a plurality of ground planes decreasing in spacing from said material with distance from said first transducer.

24. A magnetostatic wave device operable within a biasing magnetic field for delaying microwave signals wherein the delay varies by a predetermined amount with frequency, comprising:

(a) a body of material suitable for propagating magnetostatic waves;

(b) first and second transducers located in spaced apart relationship for generating an receiving magnetostatic waves along a path in said material;

(c) a plurality of ground planes which decrease from said first transducer to a minimum spacing from said material and then increase in spacing toward said second transducer.

* * * * *